(12) United States Patent
Howell (10) Patent No.: US 6,925,709 B1
(45) Date of Patent: Aug. 9, 2005

(54) METHOD AND APPARATUS FOR ASSEMBLING ELECTRONICS

(75) Inventor: Robert P. Howell, San Jose, CA (US)

(73) Assignee: Exatron, Inc., San Jose, CA (US)

( * ) Notice: Subject to any disclaimer, the term of this patent is extended or adjusted under 35 U.S.C. 154(b) by 0 days.

(21) Appl. No.: 10/310,509

(22) Filed: Dec. 4, 2002

(51) Int. Cl.⁷ .............................. H05K 3/30
(52) U.S. Cl. .................... 29/832; 29/834; 29/740; 29/759
(58) Field of Search .............. 29/832, 833, 834, 29/740, 743, 759, 760, 721, DIG. 44; 269/903; 294/64.1; 414/225, 737; 228/180.22; 257/758; 361/761

(56) References Cited

U.S. PATENT DOCUMENTS

| | | | | |
|---|---|---|---|---|
| 5,379,514 A | * | 1/1995 | Okuda et al. | 29/833 |
| 5,400,497 A | * | 3/1995 | Watanabe et al. | 29/705 |
| 5,456,001 A | * | 10/1995 | Mori et al. | 29/739 |
| 5,649,356 A | * | 7/1997 | Gieskes | 29/833 |
| 5,979,045 A | * | 11/1999 | Nishimori et al. | 29/832 |
| 6,176,011 B1 | * | 1/2001 | Shirakawa | 29/832 |
| 6,591,486 B1 | * | 7/2003 | Bolotin | 29/740 |

* cited by examiner

Primary Examiner—Minh Trinh
(74) Attorney, Agent, or Firm—Blakely, Sokoloff, Taylor & Zafman; Stephen M. De Klerk (57) ABSTRACT

An apparatus for assembling electronics is provided, comprising a support frame, at least one pick-and-place mechanism, at least one device-engaging component, a feed device, and a programmer or tester. The pick-and-place mechanism is secured to the support frame. The device-engaging component is secured to the pick-and-place mechanism. The feed device has a slender body secured to the frame to feed a plurality of electronic devices to a feed location. The programmer or tester has a slender body secured to the support frame in a side-by-side relationship relative to the feed device. The programmer or tester has a socket located at an intermediate location. The devices are movable by the device-engaging component from the feed location to the socket at the intermediate location.

5 Claims, 7 Drawing Sheets

FIG. 9

METHOD AND APPARATUS FOR ASSEMBLING ELECTRONICS

BACKGROUND OF THE INVENTION

1). Field of the Invention

This invention relates generally to an apparatus and a method for assembling electronics, more specifically to programming or testing of the electronics.

2). Discussion of Related Art

Electronic assemblies such as printed circuit boards, etc., are usually manufactured by transferring a circuit board to an assembly area and then using a pick-and-place device to transfer individual electronic components from separate, adjacent feed devices such as tape feeders or cartridge feeders to the circuit board. The circuit board, with the electronic devices thereon, is then transferred through a reflow oven, whereafter the electronic devices are secured to the circuit board.

It is often necessary to program some of these electronic devices before they are located on the circuit board. The electronic devices are usually separately programmed before being located in or on tapes, cartridges, etc. In some cases a mechanism, separate from the pick-and-place mechanism, is usually dedicated to transfer electronic devices one at a time from a feed device such as a tape feeder to an offline programmer. The electronic devices are then programmed by the offline programmer and transferred by the dedicated mechanism back to the feed device. These dedicated mechanisms are expensive, typically costing hundreds of thousands of dollars each; moreover, a separate mechanism has to be provided for each separate programmer, so that the total cost equals the cost of one dedicated mechanism multiplied by the total number of programmers. These dedicated mechanisms also take up a large amount of space that can be used, for example, by more feed devices. They also inhibit throughput, because they tend to be slow.

SUMMARY OF THE INVENTION

The invention provides an apparatus for assembling electronics, including a transport device, a feed device, a pick-and-place system, a socket, and an electronic interface. The transport device carries a circuit board to an assembly area. The feed device feeds a plurality of electronic devices to a pickup location. The pick-and-place system includes a support frame, a pick-and-place mechanism, and a device-engaging component. The pick-and-place mechanism is secured to the support frame. The device-engaging component is secured to the pick-and-place mechanism, and is movable by the pick-and-place mechanism relative to the support frame. The device-engaging component moves to the pickup location and picks one of the electronic devices up at the pickup location. The device-engaging component then transfers the electronic device to an intermediate location. The socket is located at the intermediate location to receive the electronic device. The electronic interface is connected to the socket and can provide electronic signals through the socket to the electronic device at the intermediate location. The device-engaging component is then movable by the pick-and-place mechanism to move the electronic device from the intermediate location to the circuit board, and can place the electronic device on the circuit board.

According to another aspect of the invention, an electronic assembly process is provided. A device-engaging component engages with a first electronic device at a pickup location. The device-engaging component then moves the first electronic device from the pickup location to an intermediate location. The electronic device is then connected at the intermediate location to a first socket. Signals are transferred from an external device through the first socket to the first electronic device connected to the first socket. The device-engaging component is then utilized to transfer the first electronic device from the intermediate location onto the circuit board. The electronic device is then placed on the circuit board.

According to a further embodiment of the invention, an apparatus for assembling electronics is provided, comprising a support frame, at least one pick-and-place mechanism, at least one device-engaging component, a feed device, and a programmer or tester. The pick-and-place mechanism is secured to the support frame. The device-engaging component is secured to the pick-and-place mechanism. The feed device has a slender body secured to the frame to feed a plurality of electronic devices to a feed location. The programmer or tester has a slender body secured to the support frame in a side-by-side relationship relative to the feed device. The programmer or tester has a socket located at an intermediate location. The devices are movable by the device-engaging component from the feed location to the socket at the intermediate location.

BRIEF DESCRIPTION OF THE DRAWINGS

The invention is further described by way of examples with reference to the accompanying drawings, wherein.

DETAILED DESCRIPTION OF THE INVENTION

Figure 1:
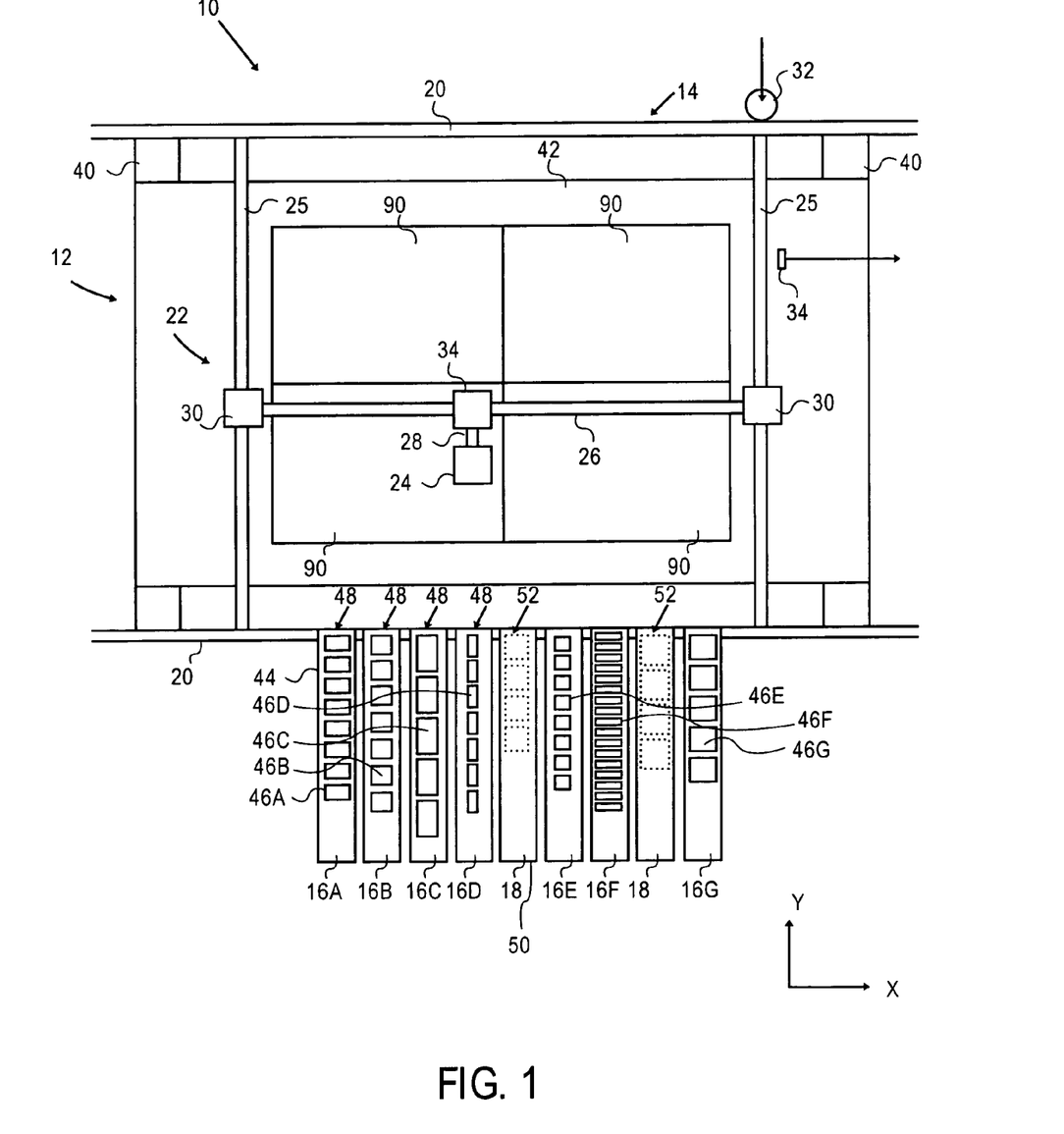
FIG. 1 is a top plan view of an apparatus for assembling electronics according to one embodiment of the invention.

FIG. 1 of the accompanying drawings illustrates an apparatus 10 for assembling electronics, according to an embodiment of the invention. The apparatus 10 includes a transport system 12, a pick-and-place system 14, feed devices 16, and programmers 18 (or testers, in another embodiment). Essentially, the apparatus 10 utilizes the pick-and-place system 14 to transfer electronic devices held by the feed devices 16 to circuit boards on the transport system 12, and also utilizes the pick-and-place system 14 to transfer some of these electronic devices to and from the programmers 18. This provides a faster and less expensive alternative than when a separate mechanism is used for transferring devices from feed devices to separate programmers and back from the programmers to the feed devices.

Specifically, the pick-and-place system 14 includes a support frame 20, a pick-and-place mechanism 22, and a device-engaging component 24. The pick-and-place mechanism 22 includes two y-rails 25, an x-rail 26, and a connecting piece 28. The y-rails 25 extend in a y-direction and are mounted to the support frame 20. The x-rail 26 extends in an x-direction and is secured between the y-rails 24 on components 30. The y-rails 25 are externally threaded and the components 30 are internally threaded. Rotation of the y-rails 25 causes movement of the components 30 in a y-direction. Electric motors 32 (one of which is shown) are mounted to the support frame 20 and connected to the y-rails 25. The y-rails 25 are rotated by the electric motors 32 when power is provided to the electric motors 32. Sensors 34 are positioned at various locations on the support frame 20, and can detect the positioning of x-rail 26 in a y-direction.

The connecting piece 28 is located on the x-rail 26 by a component 34. The component 34 can ride in an x-direction on the x-rail 26 by rotating the x-rail 26 and because of complementary thread on the x-rail 26 and in the component 34. Another electric motor (not shown) is used to rotate the x-rail of 26, and more sensors (not shown) detect the positioning of the connecting piece 28. The connecting piece 28 secures the device-engaging component 24 to the component 34, and allows for movement of the device-engaging component 24 in a vertical z-direction relative to the x-rail 26. It can thus be seen that the device-engaging component 24 is movable in a controlled manner in x-, y-, and z-directions by the pick-and-place mechanism 22.

The transport system 12 includes two conveyor rollers 40 and a conveyor belt 42. The conveyor rollers 40 are secured to the support frame 20, and the conveyor belt 42 runs over the conveyor rollers 40. Rotation of the conveyor rollers 40 by motors (not shown) causes movement of the conveyor belt 42 in an x-direction.

The feed devices 16 may, for example, be tape feeders or cartridge feeders. Each feed device 16 has a body 44 that is slender in an x-direction and long in a y-direction and in a z-direction. Each feed device 16 holds a plurality of electronic devices 46. The feed device 16 can feed the electronic devices 46 one at a time to a respective pickup location 48 at the support frame 20. The feed devices 16 are mounted to the support frame 20 adjacent to one another, so that the pickup locations 48 are at a standard pitch from one another.

Each programmer 18 also has a body 50 which is slender in an x-direction and long in a y-direction and in a z-direction. Each programmer 18 has four sockets 52 that are located behind one another in a y-direction. Alternatively, there may be between one and 16 sockets, for example, two sockets. The sockets 52 of one programmer 18 are spaced in an x-direction from a pickup location 48 of an adjacent feed device 16 by a distance which is equal to the standard pitch between the pickup locations 48 of the adjacent feed devices 16. The sockets 52 and the pickup locations 48 are all accessible by the device-engaging component 24.

Figure 2:
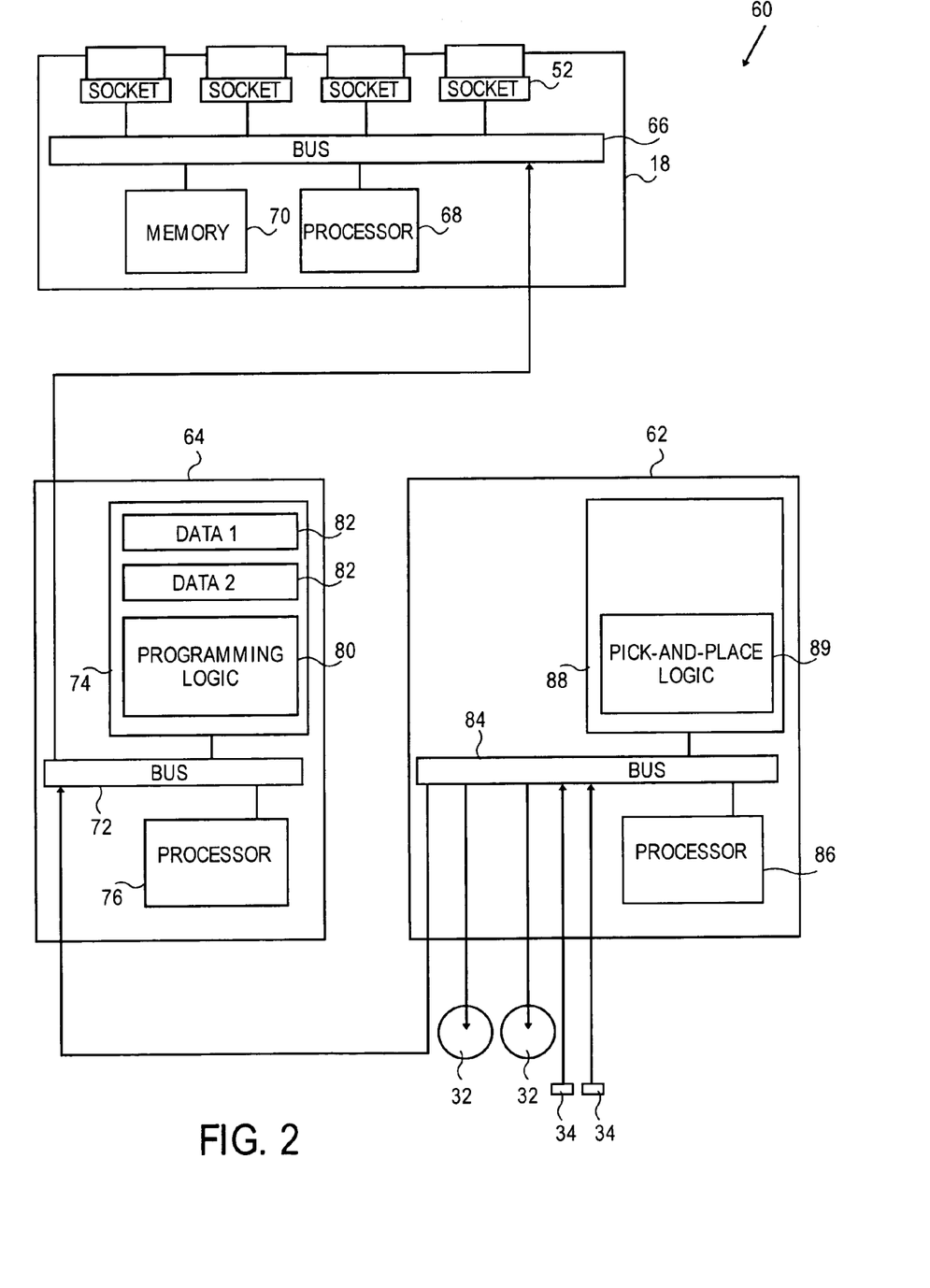
FIG. 2 is a block diagram illustrating an electrical and computer system of the apparatus.

FIG. 2 illustrates an electrical and computer system 60 of the apparatus 10 in FIG. 1. The system 60, in addition to the two programmers 18 (only one of which is shown in FIG. 2), also includes a central control unit 62 and a programmer controller 64.

The programmer 18, in addition to the sockets 52, also includes a bus 66 to which the sockets 52 are connected, a processor 68 connected to the bus 66, and memory 70 connected to the bus 66. The bus 66 provides an interface between the sockets 52 and the memory 70.

The programmer controller 64 includes a bus 72, memory 74, and a processor 76. Programming logic 80 and sets of data 82 are stored in the memory 74.

The central control unit 62 includes a bus 84, a processor 86, and memory 88. The processor 86 and the memory 88 are connected to the bus 84, and pick-and-place logic 89 is stored in the memory 88. The motors 32 and sensors 34 are directly or indirectly connected to the bus 84.

In use, the processor 86 is programmed with pick-and-place logic 89. The processor 86 receives signals from the sensor 34 so as to recognize the exact x, y, and z location of the device-engaging component 24 (FIG. 1). The motors 32 are under the control of the processor 86 so that movement of the device-engaging component 24 in x-, y-, and z-directions is under the control of the processor 86. The processor 86 is also connected through the bus 84 to the bus 72 of the programmer controller 64, and provides an output signal to the bus 72 indicative of the x-y-z positioning of the device-engaging component 24.

The processor 76 is programmed with programming logic 80. The bus 72 is connected to the bus 66 of the programmer 18. The programming logic 80 is used to control a respective set of data 82 to the memory 70 of a respective programmer 18. Different programmers may have different sets of the data 82. The programming logic 80 is also used to control download of the data from the memory 70 through the bus 66 to the sockets 52. The programming logic 80 may also store some logic in the processor 68, which may alternatively be used to download the data from the memory 70 through the bus 66 to the sockets 52.

Figure 3:
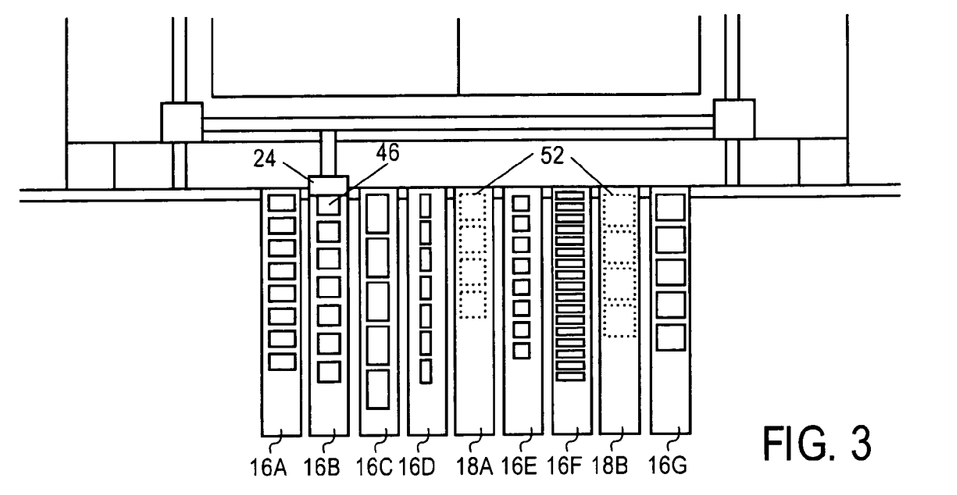
FIG. 3 is a top plan view illustrating a portion of FIG. 1 and movement of a device-engaging component to a pickup location for purposes of engaging with one electronic device of one feed device.
Figure 4:
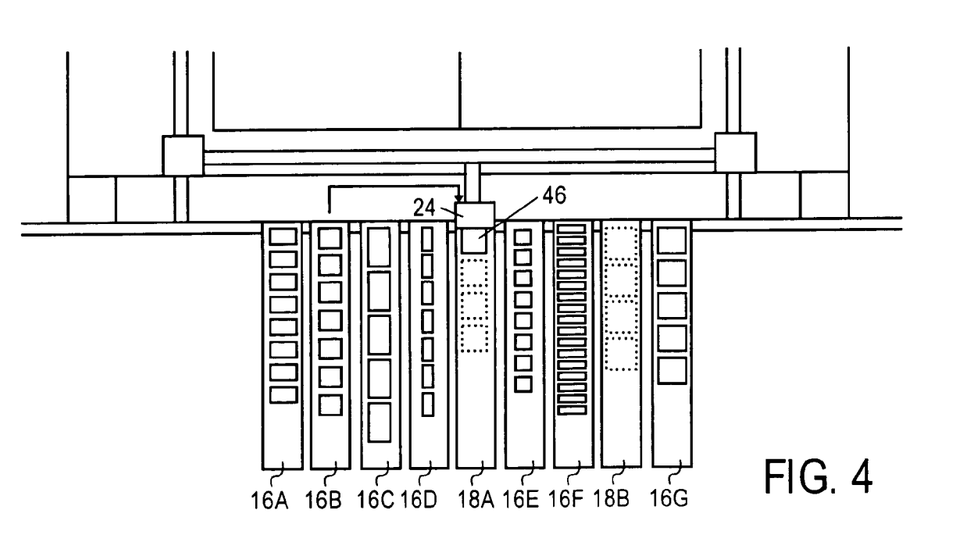
FIG. 4 is a view similar to FIG. 3, illustrating how the device-engaging component transfers the electronic device to a first socket of a programmer.

Referring specifically to FIG. 1, four circuit boards 90 are located on the conveyor belt 42 and transferred by the conveyor belt 42 into an assembly area, as shown. As illustrated in FIG. 3, the device-engaging component 24 is then moved to the pickup location of one of the feed devices 16B. The first electronic device 46 fed by the feed device 16B is then engaged with the device-engaging component 24. As illustrated in FIG. 4, the device-engaging component 24 then transfers the electronic device 46 from the feed device 16B to a first of the sockets 52 of one of the programmers 18A.

Figure 5:
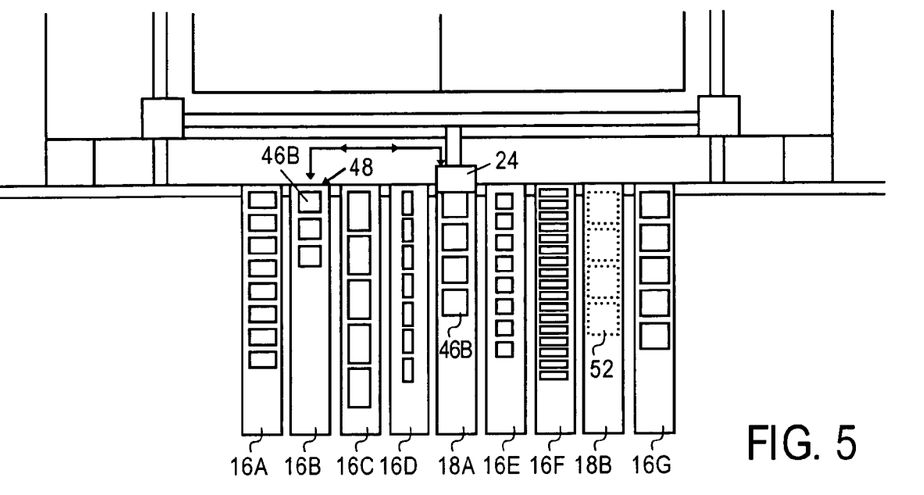
FIG. 5 is a view similar to FIG. 4, illustrating how the device-engaging component transfers more electronic devices to other sockets of the same programmer.

As illustrated in FIG. 5, the feed device 16B then feeds subsequent ones of the electronic devices 46 to the pickup location 48, and each one of the electronic devices 46 is transferred by the device-engaging component 24 to a respective socket 52 of the programmer 18A. Alternatively, multiple ones of the devices 46 may be transferred simultaneously in a single movement using a pick-up device that can hold multiple devices at the same time. The programmer 18A can now begin to download the data from the memory 70 (FIG. 2) through the bus 66 to each one of the sockets 52. The devices are programmed by transferring the data through contacts in the sockets 52 into memory of each one of the electronic devices 46 on the programmer 18A.

Figure 6:
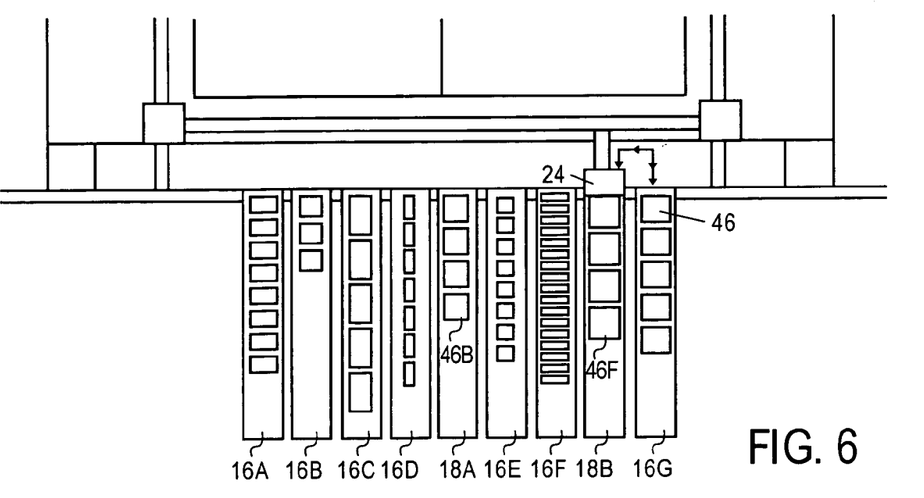
FIG. 6 is a view similar to FIG. 5, illustrating how the device-engaging component transfers other devices from another feed device to respective sockets of another programmer.

While the electronic devices 46 are programmed by the programmer 18A, the device-engaging component 24 may move to another location to perform another task. As illustrated in FIG. 6, the device-engaging component 24 may move to the feed device 16G and transfer four of the electronic devices 46 held by the feed device 16G one at a time to a respective socket 52 of the other programmer 18B. The electronic devices 46 held by the programmer 18B may then also be programmed with a dedicated set of data stored in the memory 70 (FIG. 2) of the programmer 18B. As mentioned previously, the data used to program the electronic devices 46 with the programmer 18B may be different from the data of the programmer 18A.

Figure 7:
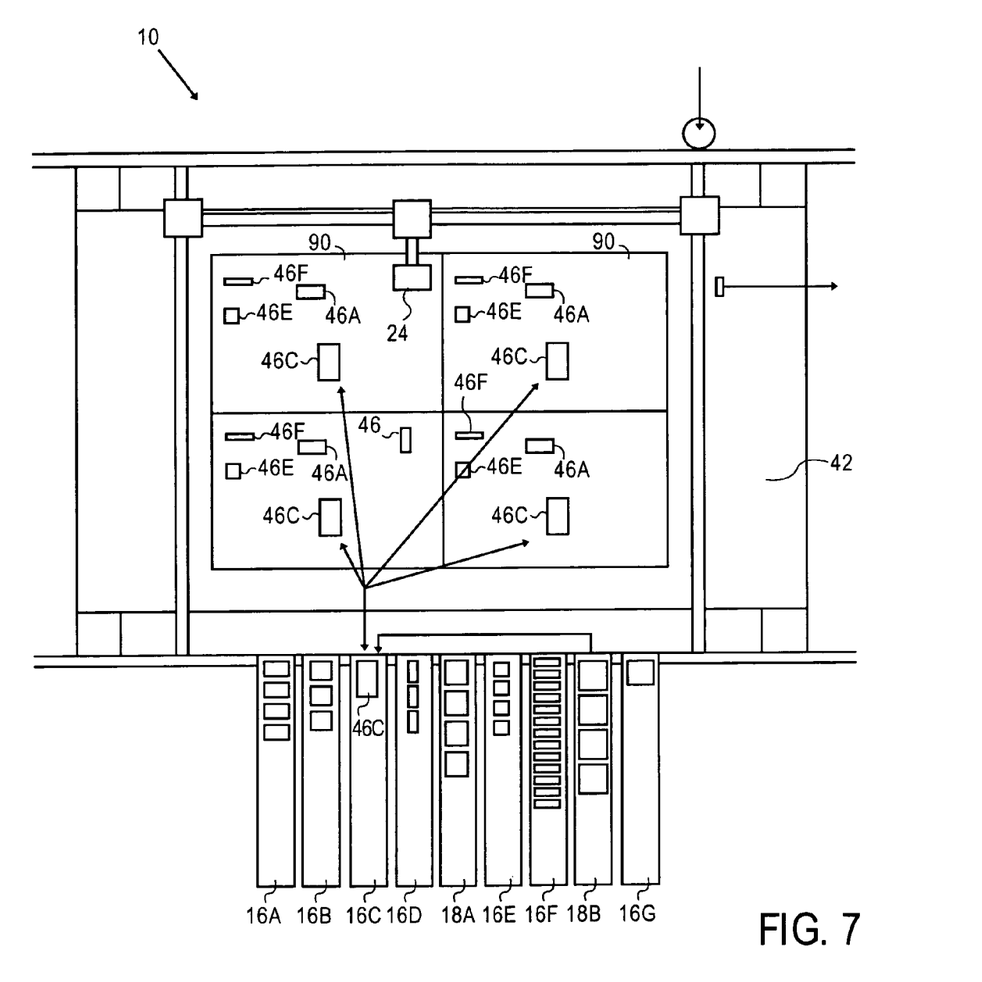
FIG. 7 is a view similar to FIG. 1, illustrating how the device-engaging component transfers electronic devices from respective feed devices to circuit boards on a conveyor belt of the apparatus while the programmers are programming the electronic devices held thereby.

While the electronic devices 46 are being programmed by the programmers 18A and 18B, the device-engaging component 24 may, for example, as illustrated in FIG. 7, move from the programmer 18B to the feed device 16C and transfer four of the electronic devices 46 held by the feed device 16C, one at a time in an x- and y-direction, to a respective one of the circuit boards 90, and then locate the respective electronic device 46 downward in a z-direction on the respective circuit board 90. In such a manner, an electronic device 46 is transferred from the feed device 16C to the same location on each one of the circuit boards 90. The device-engaging component 24 may then transfer more electronic devices 46 from the feed devices 16A, 16B, 16E, and 16F, to the circuit boards 90.

Figure 8:
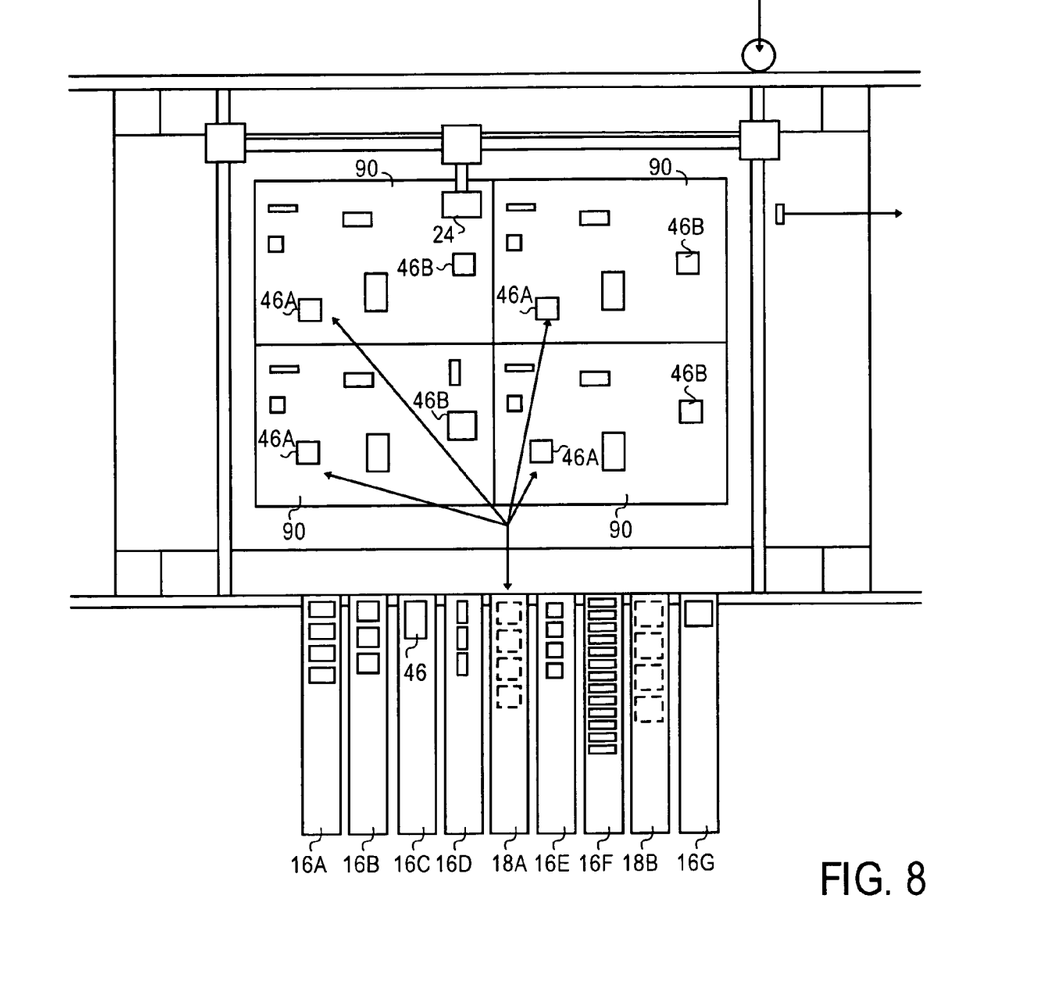
FIG. 8 is a view similar to FIG. 7, illustrating how the device-engaging component transfers electronic devices programmed by the programmers to the circuit boards.

The transfer of the electronic devices 46 to the circuit boards 90 should provide sufficient time for the programmers 18A and 18B to program the electronic devices 46. As illustrated in FIG. 8, the device-engaging component 24 subsequently moves to the sockets of the programmers 18A and 18B and transfers the electronic devices from the programmers 18A and 18B to the circuit boards 90. Each circuit board 90 will then have an electronic device 46 programmed with data from the programmer 18A, and an electronic device 46 programmed with data from the programmer 18B.

The circuit boards 90 are subsequently transported on the conveyor belt 42 to an adjacent reflow oven. The circuit board 90, with the electronic devices 46 located thereon, is heated in the reflow oven and then allowed to cool. Heating causes melting of solder connections between the respective electronic device 46 and a respective circuit board 90. Cooling of the melted material secures the respective electronic device 46 to the circuit board 90.

It can thus be seen that the same mechanism is used for transferring the electronic devices 46 from the feed device 16A to the circuit board 90, and for transferring the electronic devices 46 to and from the programmer 18B. Although only described schematically, it should be understood that such a pick-and-place device may be highly sophisticated and extremely fast. It is this speed and sophistication that is harnessed for purposes of transferring the electronic devices 46 for programming. A simpler and less expensive alternative is also provided, when compared to systems using separate and dedicated mechanisms for transferring electronic devices to offline programmers. What should also be noted is that the same mechanism is used for loading electronic devices into the sockets of more than one programmer, as opposed to conventional systems that have a dedicated transfer mechanism for each programmer.

Figure 9:
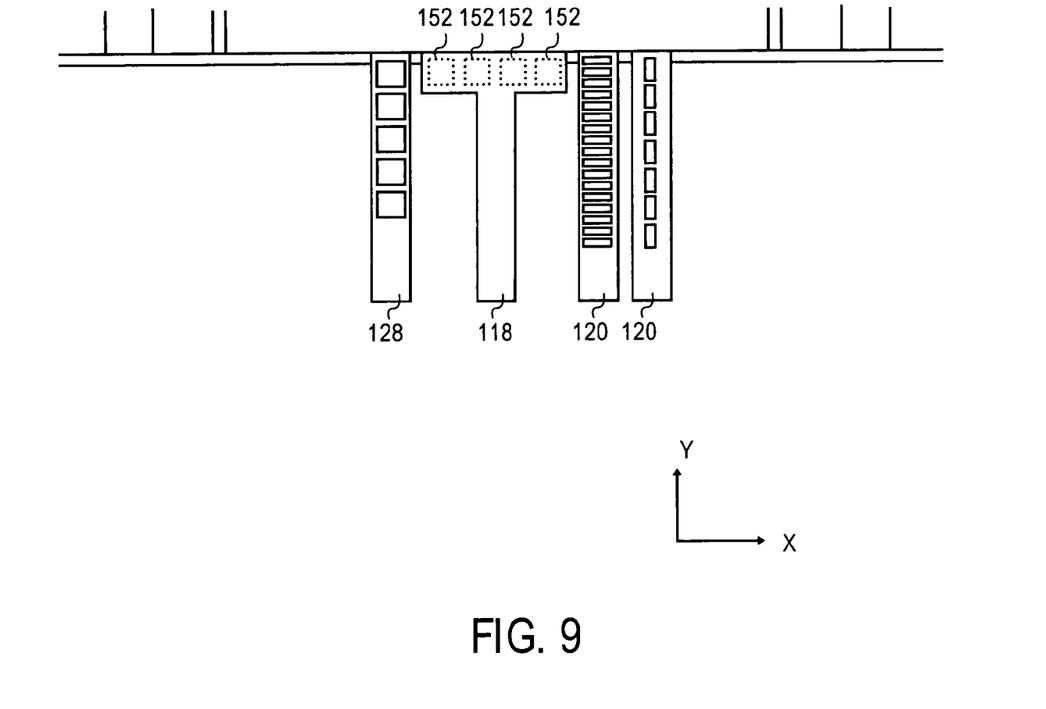
FIG. 9 illustrates a portion of an apparatus according to an alternative embodiment of the invention, having sockets located in a row in an x-direction, as opposed to a y-direction of the apparatus of FIG. 1.

In the system of FIG. 1, the sockets 52 are located behind one another in a y-direction. In FIG. 9, a programmer 118 is used having sockets 152 that are located in a row in an x-direction. The pitch between the sockets 152 is the same as the pitch between the pickup locations of feed devices 120. The programmer 118 may be necessary in systems where it may not easily be possible to move a device-engaging component so far in a y-direction to access sockets located behind one another in a y-direction. It will, however, be appreciated that a system such as the system illustrated in FIG. 1, having sockets located behind one another in a y-direction instead of next to one another in an x-direction, provides more space for locating additional feed devices and/or programmers adjacent to one another in an x-direction.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. An electronic assembly process, comprising:
   engaging a first electronic device at a pickup location with a device-engaging component;
   utilizing the device-engaging component to move the first electronic device from the pickup location to an intermediate location;
   connecting the first electronic device at the intermediate location to a first socket;
   transferring signals from an external device through the first socket to the first electronic device connected to the first socket; and
   utilizing the device-engaging component to transfer the first electronic device from the intermediate location onto a circuit board and place the first electronic device on the circuit board.

2. The process of claim 1, wherein the device-engaging component disengages from the electronic device after transferring the first electronic device to the intermediate location, further comprising:
   moving the device-engaging component from the intermediate location while the first electronic device is connected to the first socket;
   engaging a second electronic device with the device-engaging component while the first electronic device is connected to the first socket; and
   utilizing the device-engaging component to transfer the second electronic device while the first electronic device is connected to the first socket, whereafter the device-engaging component moves to the intermediate location and transfers the first electronic device to the circuit board.

3. The process of claim 2, wherein the device-engaging component transfers the second electronic device to the circuit board while the first electronic device is connected to the first socket.

4. The process of claim 2, wherein the device-engaging component transfers the second electronic device to a second socket while the first electronic device is connected to the first socket.

5. The process of claim 1, wherein the first electronic device has memory that is programmed by transferring the signals from the external device through the socket to the first electronic device.

* * * * *